(12) United States Patent
Kawakita et al.

(10) Patent No.: US 6,331,476 B1
(45) Date of Patent: Dec. 18, 2001

(54) THIN FILM TRANSISTOR AND PRODUCING METHOD THEREOF

(75) Inventors: Tetsuo Kawakita; Keizaburo Kuramasu, both of Kyotanabe; Shigeo Ikuda, Hirakata, all of (JP)

(73) Assignee: Mausushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/316,017

(22) Filed: May 21, 1999

(30) Foreign Application Priority Data

May 26, 1998 (JP) .................................................. 10-143892
Jan. 28, 1999 (JP) .................................................. 11-019535

(51) Int. Cl.⁷ .......................... H01L 21/20; H01L 21/36; H01L 21/28; H01L 21/44
(52) U.S. Cl. .......................... 438/486; 438/581; 438/583; 438/630; 438/649; 438/655
(58) Field of Search ..................................... 438/581, 583, 438/630, 649, 655, 682, 486, 151

(56) References Cited

U.S. PATENT DOCUMENTS 5,985,741 * 11/1999 Yamazaki et al. .................... 438/486
6,066,547 * 5/2000 Maekawa ............................... 438/486

FOREIGN PATENT DOCUMENTS

| 61-252667 | 11/1986 | (JP) . |
| 3-108319 | 5/1991 | (JP) . |
| 4-152676 | 5/1992 | (JP) . |
| 07 273 345 A | 10/1995 | (JP) . |

OTHER PUBLICATIONS

Kwak et al., A High Performance Thin–Film Transistor Using a Low Temperature Poly–Si by Silicide Mediated Crystallization, Mar. 2000, IEEE Electron Device Letter, vol. 21, No. 3, pp. 107–109.*

* cited by examiner

Primary Examiner—Vu A. Le
Assistant Examiner—Adam Pyonin

(57) ABSTRACT

In producing a thin film transistor used for such devices as a large-sized liquid crystal display panel with a high pixel density, a leftover of an insulating film caused by insufficient etching and a loss of a semiconductor layer caused by overetching are prevented, and a reliable electrical contact between the source and drain electrodes and the semiconductor layer is achieved. These are achieved by (a) forming a contact hole region of a silicon film so that the region has a larger thickness, for example, by making the film to have a plurality of layers, and (b) providing a silicide layer between an electrode metal and the semiconductor layer.

6 Claims, 12 Drawing Sheets

(a)

(b)

(c)

(d)

(e)

(a)

(b)

(c)

(d)

(e)

(a)

(b)

(e-1)

(e-2)

(f-1)

(d-1)

(d-2)

(d-3)

(d-3-1)

(f-1)

US 6,331,476 B1

THIN FILM TRANSISTOR AND PRODUCING METHOD THEREOF

BACKGROUND OF THE INVENTION (1) Field of the Invention

The present invention relates to a thin film transistor, and more particularly to a thin film transistor device so formed as to have a predetermined array on a substrate, which is used for a liquid crystal display and the like device, and a producing method thereof.

(2) Description of the Prior Art

In recent years, liquid crystal displays have been widely used for equipment for multi-media systems, portable electronic products, and communication devices. In such liquid crystal displays used for the electronic equipment as above, a requirement for a higher resolution has been growing. In other words, a smaller pixel size and higher performance are increasingly required.

Particularly, in a liquid crystal display panel using a thin film transistor (TFT), size reduction of a pixel part and the TFT composing the driving circuit thereof has been developed.

FIG. 1 shows an example of a structure of a thin film transistor known as a top gated type, used for the pixel part.

As shown in the figure, an $SiO_2$ film 2 as an undercoat is formed on a glass substrate 1, and a semiconductor layer (material) 3 consisting of silicon poly-crystallized by laser annealing is provided thereon. A gate insulating film 5 is formed in a position that forms a channel, a gate electrode is provided thereon, and an interlayer dielectric layer 7 is formed thereover. The interlayer dielectric layer serves to prevent a contact between a source and drain electrode lines and the semiconductor layer in each of a large number of transistors formed on the substrate, and to prevent a short circuit of the transistors and pixel electrodes.

In a channel region, which is a region disposed between a source electrode and a drain electrode, a contact hole 9 is provided in the interlayer dielectric layer 7 at each of the outward end portions of the channel region, so as to reach the semiconductor layer 3, and a source electrode 10 and a drain electrode 11, both composed of a metal, are provided therein.

In portions 31 and 32 of the semiconductor layer 3 that are to be in contact with the source electrode 10 and the drain electrode 11 respectively, impurity atoms with three valences or five valences are doped by ion doping and the like method to reduce the resistance of the surface portion thereof.

This is intended to reduce a contact resistance by greatly lowering the electric barrier generated in the contact of the semiconductor layer and a metal layer.

However, in the structure shown in FIG. 1, such problems as described below are induced in cases where size reduction of TFTs and panel size increase are further advanced.

Firstly, a problem regarding a construction of the TFT is described below. As the size reduction of the TFT advances, the contact area between a semiconductor layer and a metal layer is also rendered small. Inversely, a contact resistance is rendered larger. The contact resistance greatly affects a driving capability of a thin film transistor, and as the value of the contact resistance is larger, the driving capability of the TFT is degraded. In consequence of future size reduction of TFTs and hence increasing tendency of such a disadvantageous effect as described above, it is expected to cause a failure to operate transistors located distant from a signal supply, thereby a failure to sufficiently charge pixels, and thus a failure to obtain a picture image.

Secondly, a problem regarding the fabrication, namely, a difficulty involved in forming a contact hole is described below with reference to FIG. 2.

(a) A gate insulating film 5 is formed on a polycrystallized semiconductor thin film 3, and a gate electrode is formed on the gate insulating film 5. An interlayer dielectric layer 7 is formed over the gate insulating film 5 and the gate electrode 6.

(b) A contact hole is opened to form a source electrode and a drain electrode. As the size reduction of TFTs advances, a diameter of the contact hole is expected to be smaller. For example, it is currently smaller than 10 $\mu$m, but a diameter of several micrometers is expected in recent years and even approximately 1 $\mu$m will be desired. Forming such a small contact hole by wet etching is difficult in respect of obtaining an accurate diameter size (an error of about 2 $\mu$m or 3 $\mu$m is inevitable not only at present but in the near future), and therefore dry etching is employed.

In order to perform such dry etching, first, a resist pattern 8 with an aperture 80 is formed. The aperture 80 is opened in a region where each electrode is to be formed.

(c) A portion of the interlayer dielectric layer and the gate insulating film is removed with the use of an etching gas 21. The etching gas 21 used here is for example a mixed gas of $CF_4$ and $CHF_3$ and $O_2$ and reactive ion etching (RIE) is performed therewith.

The gas to be used in the etching is a gas used for etching Si type material including Si—Ge and Si—Ge—C, and is capable of etching both Si and oxide films such as an interlayer dielectric layer and a gate oxide film. Therefore, in making a contact hole to form a source electrode and a drain electrode, a condition that a selective ratio of Si and the oxide film is rendered high (that the oxide film is more readily etched) should be met. However, at present or even in the near future, it is difficult to meet such a condition that only the oxide film is completely etched away and Si is left unetched, since both substances have similar chemical characteristics.

Accordingly, in order to completely etch away portions of the oxide films 5 and 71, formed as the interlayer dielectric layer and the gate insulating film underneath the contact hole, in an entire area of the substrate, the semiconductor layer (Si) under the contact hole needs to be slightly etched as well.

However, according to a recent requirement for the size reduction of TFTs, as well as such requirements that an amorphous silicon is fused and recrystallized on a glass substrate by laser irradiation and a crystal with as large a crystal grain as possible, preferably a single crystal, is desired in the step, the thickness of the semiconductor layer tends to be further reduced to 1000 Å or less, preferably 300–600 Å, specifically approximately 500 Å.

Hence, in etching the oxide films, if a thickness variation of the oxide films and an etching rate variation are large, the semiconductor layer is excessively etched, and as a result, as shown in FIG. 2(d), the semiconductor layer is made too thin or in a severe case completely removed in a portion 30. Even if not made too thin, the semiconductor layer is damaged in a region underneath the contact hole and therefore a formation of a high resistance layer 33 can be induced.

When such disadvantageous effects as above are caused, a contact resistance between the semiconductor layer and the source or drain electrode is rendered too high, or even non-conductive state is incurred, and thus a good contact cannot be obtained. Such problems are critical in consideration of recent size increase of liquid crystal display panels, and size reduction and number increase of TFTs in line with the increase of pixel density.

However, at present or even in the near future, it would be difficult to increase the thickness of the semiconductor layer or to employ other gases only for an insulating material that has an advantageous effect.

In addition, such problems are induced also in a bottom-gated transistor.

Accordingly, a development of a TFT and its producing method is desired in which a contact resistance is suppressed low even when the device size is reduced, and etching for making contact holes is readily performed.

SUMMARY OF THE INVENTION

In view of the foregoing, according to a first group of the invention, a semiconductor film is so formed that a thickness of the semiconductor film is increased in only each region and the vicinity thereof in which a source electrode and drain electrode are to be formed. Thereby, while a high performance as a thin film transistor is maintained, it is achieved to prevent such undesirable effect that the semiconductor layer is etched away by overetching, and to realize a low resistance contact.

According to a second group of the invention, a thin silicide layer is formed between a semiconductor layer and each of source and drain electrodes. Thereby, a reliable electrical contact is obtained, and moreover the silicide layer serves as an etch stop in etching an interlayer dielectric layer.

According to a first aspect in the first group of the invention, there is provided a method of producing a thin film transistor formed on a substrate, the thin film transistor comprising a semiconductor thin film in which a channel region, a source region, and a drain region are to be formed, an interlayer dielectric layer, a gate insulating film, a source electrode, and a drain electrode, each of the source electrode and the drain electrode being connected with the semiconductor thin film via a contact hole, the method comprising:

a step of increasing a thickness of the semiconductor thin film in at least a region in which the contact hole is to be formed for connecting the semiconductor thin film with one of the source electrode and the drain electrode, so that the region in which the contact hole is to be formed has a larger thickness than a thickness of the semiconductor thin film in the channel region.

The contact hole is formed in the interlayer dielectric layer when the transistor to be produced is a top gated type, and in the interlayer dielectric layer and the gate insulating film when the transistor is a bottom gated type.

In the above step of increasing a thickness of the semiconductor thin film, the region in which the contact hole is to be formed may include an adjacent region extending outwardly 1–2 μm or larger with respect to the region where the contact hole is formed, in view of limitations resulting from the manufacture.

The thickness of the region in which the contact hole is to be formed, may be, for example, approximately twice (1.5–2.5 times, more preferably 1.85–2.15 times) larger than the thickness of the channel region, or a thickness of approximately 300 Å (200–400 Å, more preferably 270–330 Å).

It is to be noted that expelling hydrogen, laser annealing, bonding dangling bonds, doping, and the like treatment is performed for the semiconductor on the substrate when appropriate, so that the resulting transistor sufficiently works as a TFT, and this applies to the other aspects of the present invention as well.

According to a second aspect of the invention, the step of increasing a thickness of the semiconductor thin film in the above first aspect of the invention may comprise a step of increasing a thickness of the semiconductor thin film so that a thickness of the semiconductor thin film in the region in which the contact hole is to be formed results in larger than a thickness of the other region of the semiconductor thin film, by repeating a plurality of times a step of forming the semiconductor thin film.

In order to minimize the number of required manufacturing step, the number of the times of repeating the step of forming the semiconductor thin film is preferable to be twice.

According to a third aspect of the invention, there is provided a method of producing a thin film transistor comprising the steps of:

forming a first semiconductor thin film in only each position on a substrate corresponding to a source electrode and a drain electrode, selectively forming a second semiconductor thin film in a region where the thin film transistor is desired, the second semiconductor thin film formed over the first semiconductor thin film, forming a gate insulating film over the second semiconductor thin film, forming a gate electrode on the gate insulating film, forming an interlayer dielectric layer over the gate insulating film and the gate electrode, forming a contact hole with sufficient accuracy by means of dry etching in a position in the gate insulating film and the interlayer dielectric layer corresponding to each of the source electrode and the drain electrode to be formed, and forming the source electrode and the drain electrode so that the electrodes are connected with the semiconductor thin film via the contact hole.

According to a fourth aspect of the invention, there is provided a method of producing a thin film transistor comprising the steps of:

forming a gate electrode in a predetermined position on a substrate, forming a gate insulating film over the gate electrode, forming a first semiconductor thin film in only each position corresponding to a source electrode and a drain electrode, selectively forming a second semiconductor thin film over the first semiconductor thin film, forming an interlayer dielectric layer over the second semiconductor thin film, forming a contact hole by dry etching in each position in the interlayer dielectric layer corresponding to the source electrode and the drain electrode, and forming the source electrode and the drain electrode so that the electrodes are connected with the semiconductor thin film via the contact hole.

According to the method described above, a bottom gated type transistor is attained by a similar method to the method of the third aspect, while a top gated type transistor is produced by the method of the third aspect.

According to a fifth aspect of the invention, there is provided a method of producing a thin film transistor comprising the steps of:

forming a first semiconductor thin film in a predetermined position on a substrate, forming a second semiconductor thin film in only each position on the first semiconductor thin film corresponding to a source electrode and a drain electrode to be formed, forming a gate insulating film over the first and second semiconductor thin films, forming a gate electrode on the gate insulating film, forming an interlayer dielectric layer over the gate insulating film and the gate electrode, forming a contact hole by dry etching in each of the positions in the gate insulating film and the interlayer dielectric layer corresponding to the source electrode and the drain electrode, and forming the source electrode and the drain electrode so that the electrodes are connected with the semiconductor thin film via the contact hole.

It is to be understood that each position corresponding to the source electrode and the drain electrode, as mentioned in the step of forming the second semiconductor thin film, includes an outer circumferential region of each electrode as a margin, as well as each region in which the electrodes are to be formed.

According to a sixth aspect of the invention, there is provided a method of producing a thin film transistor comprising the steps of:

forming a gate electrode in a predetermined position on a substrate, forming a gate insulating film over the gate electrode, forming a first semiconductor thin film over the gate electrode, forming a second semiconductor thin film in only each position in the first semiconductor thin film corresponding to a source electrode and a drain electrode, forming an interlayer dielectric layer over the second semiconductor thin film, forming a contact hole by dry etching in each of the positions in the interlayer dielectric layer corresponding to the source electrode and the drain electrode, and forming the source electrode and the drain electrode so that the source electrode and the drain electrode are connected with the semiconductor thin film via the contact hole.

According to the method described above, a bottom gated type transistor is attained by a similar method to the method of the fifth aspect, while a top gated type transistor is produced by the method of the fifth aspect.

According to a seventh aspect of the invention, there is provided a method producing a thin film transistor comprising the steps of:

forming a semiconductor thin film having a thickness larger than a required thickness, reducing the thickness of the semiconductor thin film in an excessive region except each region corresponding to a source electrode and a drain electrode, so that a thickness of the excessive region except each region corresponding to a source electrode and a drain electrode results in the required thickness, forming a gate insulating film over the semiconductor thin film, forming a gate electrode on the gate insulating film, forming an interlayer dielectric layer over the gate electrode and the gate insulating film, forming a contact hole by dry etching in each of the positions in the interlayer dielectric layer corresponding to the source electrode and the drain electrode, and forming the source electrode and the drain electrode so that the electrodes are connected with the semiconductor thin film via the contact hole.

The required thickness is, more specifically, a thickness essentially required as a channel region of a TFT.

reducing the thickness of the semiconductor thin film in an excessive region except each region corresponding to a source electrode and a drain electrode, so that a thickness of the excessive region except each region corresponding to a source electrode and a drain electrode results in the required thickness, by, for example, reactive etching and the like, forming a gate insulating film over the semiconductor thin film, forming a gate electrode on the gate insulating film, forming an interlayer dielectric layer over the gate electrode and the gate insulating film, forming a contact hole by dry etching in each of the positions in the interlayer dielectric layer corresponding to the source electrode and the drain electrode, and forming the source electrode and the drain electrode so that the source electrode and the drain electrode are connected with the semiconductor thin film via the contact hole.

According to an eighth aspect of the invention, there is provided a method of producing a thin film transistor, comprising the steps of:

forming a gate electrode in a predetermined position on a substrate, forming a gate insulating film over the gate electrode, forming a semiconductor thin film having a thickness larger than a required thickness, reducing the thickness of the semiconductor thin film in a region except each of the regions corresponding to a source electrode and a drain electrode to be formed, so that a thickness of the region except each of the corresponding regions results in the required thickness, forming an interlayer dielectric layer over the semiconductor thin film, forming a contact hole by dry etching in each of the positions in the interlayer dielectric layer corresponding to the source electrode and the drain electrode, and forming the source electrode and the drain electrode so that electrodes are connected with the semiconductor thin film via the contact hole.

According to the method described above, a bottom gated type transistor is attained by a similar method to the method of the seventh aspect, while a top gated type transistor is produced by the method of the seventh aspect.

According to a ninth aspect of the invention, there is provided a thin film transistor formed on a substrate, comprising a semiconductor thin film in which a channel region, a source region, and a drain region are to be formed, an interlayer dielectric layer, a gate electrode, a gate insulating film, a source electrode, and a drain electrode, the electrodes being connected with the semiconductor thin film via a contact hole, the thin film transistor wherein:

a thickness of the semiconductor thin film in a region where the contact hole is to be formed for connecting the semiconductor thin film with one of the source electrode and the drain electrode, is larger than a thickness of the semiconductor thin film in the channel region.

The contact hole is formed in the interlayer dielectric layer when the transistor to be produced is a top gated type, and in the interlayer dielectric layer and the gate insulating film when the transistor is a bottom gated type.

In view of the necessity to maintain uniformity of amorphous silicon in laser annealing, the thickness of the semiconductor thin film in a region where the contact hole is formed is preferable to be twice or approximately 300 Å larger than the thickness in the channel region. However, such a preferable thickness is determined depending upon the size of the substrate and accuracy in dry etching.

According to a tenth aspect of the invention, the semiconductor thin film in the above ninth aspect may be composed of one of silicon, silicon-germanium, and silicon-germanium-carbon. These materials are the same type of materials as the insulating materials, and widely used materials for liquid crystal displays.

According to an 11th aspect of the invention, which pertains to the second group of the invention to be described hereinafter, there is provided a method of producing a thin film transistor comprising, on a substrate, a gate electrode, a source electrode, a drain electrode, and a semiconductor film wherein a channel region, a source region and a drain region are provided, the method comprising a step of forming a silicide layer between the semiconductor film and each of the source electrode and the drain electrode.

According to this aspect, the silicide layer as a portion (undermost layer) of the electrodes is provided between the semiconductor film and each of the source electrode and the drain electrode in a method of producing a transistor with the same uses and purposes as the devices according to the first group of the invention, and the transistor to be produced may be either a top gated type or a bottom gated type. The silicide layer serves to ensure the electrical connection between the semiconductor film and the electrodes, and to protect a poly-silicon film when forming the contact hole.

According to a 12th aspect of the invention, the silicide layer in the method of the 11th aspect may comprise a silicide of a metal selected from the group consisting of titanium, nickel, platinum, and cobalt.

Such metals are easy to control the reaction with silicon, and form a silicide with poly-silicon produced by laser annealing and amorphous silicon at a temperature lower than a heat resistance limit of the glass substrate (approx. 600° C.). It is noted that in the cases of crystalline silicon with a large crystal even such metals require a temperature over 600° C. to obtain a practically usable silicide.

According to a 13th aspect of the invention, in the method of the 11th aspect above:

each of the source electrode and the drain electrode may comprise a plurality of metal layers, a step of forming an undermost layer of the plurality of metal layers may be performed prior to the step of forming a silicide layer, the undermost layer being formed in each of the positions where the source electrode and the drain electrode are to be formed, and the undermost layer being a metal layer composed of at least one metal selected from the group consisting of titanium, nickel, platinum, and cobalt, and the step of forming a silicide layer may comprise a step of reacting the metal in the undermost layer with silicon in the silicon film.

In the above step of forming a silicide layer, the metal in at least a lower portion of the undermost layer is made to react with silicon in an upper portion of the silicon film, and therefore the electrical connection between them is ensured.

According to a 14th aspect of the invention, there is provided a method of producing a thin film transistor comprising the steps of:

forming a silicon film in a predetermined region on a substrate, forming a gate insulating film on an entire area of the silicon film, forming a first metal film by removing a portion of the gate insulating film located in each position corresponding to a source electrode and a drain electrode and thereafter forming a first metal film on an entire area of the substrate, forming a silicide layer in a region where the first metal film is directly in contact with the silicon film, by reacting the first metal film with the silicon film with heat, forming an interlayer dielectric layer, by firstly removing the first metal film, thereafter forming, in a position on the silicon film where a gate electrode is to be formed, a second metal film composed of a metal resistant to an etching gas for etching the interlayer dielectric layer, and thereafter forming the interlayer dielectric layer on the entire area of the substrate, forming a contact hole by dry etching the interlayer dielectric layer utilizing the silicide layer and the second metal film as an etch stopper, so as to provide the contact hole in each of the positions corresponding to the gate electrode, the source electrode, and the gate electrode, and forming a third metal film composed of a metal capable of being in good contact with silicide on the entire area of the substrate and removing an unnecessary portion of the third metal film to selectively form the gate electrode, the source electrode, and the drain electrode, or to selectively form an undermost layer of the electrodes (in the case of forming an undermost layer, the upper portion is composed of a different metal from the metal composing the third metal film).

It is to be understood that each position corresponding to a source electrode and a drain electrode includes a region slightly extending outwardly with respect to the diameter of the bottom portion of the contact hole, in which the electrodes are to be formed.

In the above step of forming a silicide layer in a region where the first metal film is directly in contact with the silicon film, a heating temperature should be sufficiently lower than a heat resistance limit of a glass substrate.

According to a 15th aspect of the invention, the silicon film in the method of the above 14th aspect may be formed to have a thickness of 650 Å or less in the step of forming a silicon film, and a diameter of an undermost portion of the contact hole may be formed to be 4 μm or smaller in the step of forming a contact hole.

The effect of lowering electrical resistance by the silicide is maximized by the above construction.

According to a 16th aspect of the invention, in the method of the above 15th aspect, the same metal as the first metal film may be selected for a material for the third metal film prior to the step of forming a contact hole.

Since the same metal as the first metal film is used for a material for the third metal film, electrical contact is improved.

According to a 17th aspect of the invention, there is provided a method of producing a thin film transistor comprising the steps of:

forming a gate electrode in a predetermined position on a substrate, forming a gate insulating film over the gate electrode, forming a silicon film in a predetermined position on the gate insulating film, forming a first metal film in only each position corresponding to a source electrode and a drain electrode, forming a silicde layer in a region where the first metal film is directly in contact with the silicon film by reacting the first metal film with the silicon film with heat, forming an interlayer dielectric layer in an entire area of the silicon film, forming a contact hole by dry etching the interlayer dielectric layer using the silicide layer as an etching stopper, so as to provide the contact hole in each position corresponding to the source electrode and the gate electrode, and forming a second metal film on an entire area of the substrate and thereafter removing an excessive portion of the second metal film to form the source electrode and the drain electrode or an undermost layer thereof.

According to a 18th aspect of the invention, in the method of the 17th aspect, the silicon film may be so formed as to have a thickness of 650 Å or less in the step of forming a silicon film, and the contact hole may be so formed that a diameter of an undermost portion of the contact hole results in 4 μm or smaller in the step of forming a contact hole.

According to a 19th aspect of the invention, in the method of the 17th aspect, the same metal as the first metal film may be selected for a material for the third metal film prior to the step of forming a contact hole.

In the above 17th to 19th aspects of the invention, the same effects as those of the 14th to 16th aspects are respectively achieved in a bottom gated type thin film transistor, while the 14th to 16th aspect are achieved in a top gated transistor.

According to a 20th aspect of the invention, there is provided a method of producing a thin film transistor comprising the steps of:

forming a silicon film in a predetermined position on a substrate, forming a silicide layer between a first metal film and the silicon film by forming the first metal film in only each position corresponding to a source electrode and a drain electrode on the substrate, and thereafter reacting the first metal film with the silicon film, forming an insulating film over an entire area of the silicon film, and a second metal film comprising a metal unetched by an etching gas used for etching the insulating film, forming an interlayer dielectric layer by etching the second metal film except in a position corresponding to a gate electrode, and thereafter forming the interlayer dielectric layer in an entire area of the substrate, forming a contact hole in each position corresponding to a gate electrode, the source electrode, and the drain electrode, by dry etching the interlayer dielectric layer utilizing the silicide layer and the second metal film left unetched in the position corresponding to the gate electrode as an etch stop, forming a third metal film on the entire area of the substrate and thereafter removing an excessive portion of the third metal film to form the gate electrode, the source electrode, and the drain electrode.

According to a 21st aspect of the invention, in the above method of the 20th aspect, the silicon film may be so formed as to have a thickness of 650 Å or less in the step of forming a silicon film, and the contact hole may be so formed that a diameter of an undermost portion of the contact hole results in 4 μm or smaller in the step of forming a contact hole.

According to a 22nd aspect of the invention, in the above method of the 20th aspect, the same metal as the first metal film may be selected for a material for the third metal film prior to the step of forming a contact hole.

According to a 21st and 22nd aspects of the invention, the same effects as those of the methods of the 15th and 16th aspects are achieved.

According to a 23rd aspect of the invention, there is provided a method of producing a thin film transistor formed on a substrate, the thin film transistor comprising a silicon thin film in which a channel region, a source region, and a drain region are to be formed, an interlayer dielectric layer, a gate insulating film, a source electrode, and a drain electrode, the source electrode and the drain electrode being connected with the silicon thin film via a silicide layer in a contact hole formed in the interlayer dielectric layer and the gate insulating film, the method comprising the steps of:

forming a first metal film in a position corresponding to a gate electrode in the gate insulating film after forming a silicide in the contact hole, the first metal film consisting of the same metal as a metal composing the silicide layer and being the undermost layer of the gate electrode with a multiple-layer structure, forming a second metal film over the first metal film, the second metal film being a second layer in the gate electrode with a multiple-layer structure, having a predetermined thickness, and consisting of a metal which is not etched by an etching gas for the interlayer dielectric layer, forming the gate electrode serving as a mask, by removing an excessive portion of the first metal film and the second metal film so that the first metal film extends towards at least one of the source electrode and the drain electrode with respect to the most outer edge of the second metal film, and doping predetermined impurity ions by implanting the ions from an upper direction of the substrate into a semi-finished thin film transistor in which the gate electrode is formed.

In the above construction, the gate electrode serving as a mask is provided. In the gate electrode, there are provided an under layer comprising a metal that forms a silicide, and an upper layer serving as an etch stopper and comprising a metal with a low electrical resistance, and the cross section of the electrode in a direction along the line connecting a source electrode and a drain electrode varies a two stage in at least one side. The gate electrode is used as a mask in doping impurities to realize a thin film transistor with an LDD structure. A thickness of each of the layers in the gate electrode is determined in consideration of the use as a mask.

According to a 24th aspect of the invention, in the above method of the 23rd aspect, the silicon film may be so formed as to have a thickness of 650 Å or less in the step of forming a silicon film, and the contact hole may be so formed that a diameter of an undermost portion of the contact hole results in 4 μm or smaller in the step of forming a contact hole.

According to a 25th aspect of the invention, in the above method of the 23rd aspect, a metal such that a reaction with silicon is highly controllable and a capability of preventing hydrogen in doping is high, may be selected for a metal material for forming the silicide and the first metal film.

According to the 24th and 25 aspects of the invention, the same effects as in the methods of the 15th and 16th aspects are respectively achieved. In addition, in the 25th aspect of the invention, implanting hydrogen in the channel region is suppressed.

According to a 26th aspect of the invention, there is provided a method of producing a thin film transistor formed on a substrate, the thin film transistor comprising a silicon thin film in which a channel region, a source region, and a drain region are to be formed, an interlayer dielectric layer, a gate insulating film, a source electrode, and a drain electrode, the source electrode and the drain electrode being connected with the silicon thin film via a silicide layer in a contact hole formed in the interlayer dielectric layer and the gate insulating film, the method comprising the steps of:

forming a first metal film in a position corresponding to a gate electrode in the gate insulating film after forming a silicide in the contact hole, the first metal film consisting of the same metal as the metal composing the silicide and being the undermost layer of the gate electrode with a multiple-layer structure, forming a silicon film having a predetermined thickness over the first metal film so that the silicon film extends towards at least one of the source electrode and the drain electrode with respect to the most outer edge of the first metal film, forming a metal film for forming silicide on the silicon film in a region in the contact hole in which the silicide layer is to be formed, forming the silicide layer in the contact hole and between the first metal film in the position corresponding to the gate electrode and the silicon film thereover, and doping predetermined impurity ions by implanting the ions, utilizing the first metal film, the silicide layer, and the silicon film as a mask, from an upper direction of the substrate into a semi-finished thin film transistor in which the gate electrode is formed.

In the above 26th aspect of the invention, doping impurities is performed utilizing the gate electrode as a mask that has an undermost layer of metal, an intermediate layer of silicide, and an upper layer of silicon. As a result, the LDD structure is made to have a two-stage structure. The upper layer of silicon may be left in portion or may be removed upon completion of the transistor. The thickness of the metal layer, the thickness of the silicon layer, and the temperature and time for forming the silicide layer are determined in consideration of the use as a mask.

According to a 27th aspect of the invention, in the above 26th aspect of the invention, the silicon film may be so formed as to have a thickness of 650 Å or less in the step of forming a silicon film, and the contact hole may be so formed that a diameter of an undermost portion of the contact hole results in 4 µm or smaller in the step of forming a contact hole.

According to a 28th aspect of the invention, in the above 26th aspect of the invention, a metal such that a reaction with silicon is highly controllable and a capability of preventing hydrogen in doping is high, may be selected for a metal material for forming the silicide and the first metal film.

According to a 27th and 28th aspects of the invention, the same effects as those of the 15th, 16th, and 25th aspects are achieved.

According to a 29th aspect of the invention, there is provided a thin film transistor formed on a substrate, comprising a semiconductor thin film in which a channel region, a source region, and a drain region are to be formed, an interlayer dielectric layer, a gate electrode, a gate insulating film, a source electrode, and a drain electrode, the electrodes being connected with the semiconductor thin film via a contact hole, the thin film transistor further comprising:

a silicde layer between each of the source and drain electrodes and the semiconductor thin film in a region in which the contact hole is to be formed.

The silicide layer serves to make an electrical contact between the electrodes and the semiconductor layer.

According to a 30th aspect of the invention, in the transistor of the above 29th aspect, a portion of each of the source electrode and the drain electrode being in contact with the silicide layer in each of the source region and the drain region may be composed of the same metal as the metal composing the silicide.

Since the same metal in the silicide layer is used, electrical contact is improved.

According to a 31st aspect of the invention, the silicide layer in the transistor of the above 30th aspect may comprise a silicide of one of titanium, nickel, platinum, and cobalt.

Therefore, the same effects as those of the 13th aspect are achieved.

According to a 32nd aspect of the invention, in the transistor of the above 30th aspect, the silicon thin film may have a thickness of 650 Å or less, and the contact hole may have a diameter of 4 µm or smaller in an undermost portion of the contact hole.

In this aspect of the invention, the same effects as those of the 15th aspect are achieved.

According to a 33rd aspect of the invention, in the transistor of the above 29th aspect, the silicide layer may comprise a silicide of one of titanium, nickel, platinum, and cobalt.

Therefore, the same effects as those of the 13th aspect are achieved.

According to a 34th aspect of the invention, a metal material for the silicide in the 33rd aspect may comprise a silicide of one of titanium, nickel, platinum, and cobalt.

In this aspect of the invention, the same effects as those of the 15th aspect are achieved.

According to a 35th aspect of the invention, there is provided a thin film transistor having an LDD structure formed on a substrate, comprising a semiconductor thin film in which a channel region, a source region, and a drain region are to be formed, an interlayer dielectric layer, a gate electrode, a gate insulating film, a source electrode, and a drain electrode, the electrodes being connected with the semiconductor thin film via a contact hole, the thin film transistor wherein:

a silicide layer is provided between each of the source and drain electrodes and the semiconductor thin film in a region in which the contact hole is to be formed, the gate electrode has a multiple-layer structure in which an undermost layer consists of the same metal as a metal composing the silicide layer, and an upper layer consists of a metal layer extending towards at least one of the source region and the drain region with respect to the outermost edge of the undermost layer, the gate electrode serving as a mask, and the semiconductor thin film has an LDD structure in which impurity ions are distributed corresponding to a capability of shielding impurity ions retained by the gate electrode serving as a mask.

According to a 36th aspect of the invention, in the transistor of the 35th aspect, the silicide in each of the gate electrode, the source electrode, and the drain electrode may be a silicide of one of titanium, nickel, platinum, and cobalt.

According to a 37th aspect of the invention, in the transistor of the 36th aspect, the semiconductor thin film may have a thickness of 650 Å or less, and each of the source electrode and the drain electrode may have a diameter of 4 µm or smaller in a portion being in contact with the silicide layer.

According to a 38th aspect of the invention, there is provided a thin film transistor having an LDD structure formed on a substrate, comprising a semiconductor thin film in which a channel region, a source region, and a drain region are to be formed, an interlayer dielectric layer, a gate electrode, a gate insulating film, a source electrode, and a drain electrode, the electrodes being connected with the semiconductor thin film via a contact hole, the thin film transistor wherein:

a silicide layer is provided between each of the source and drain electrodes and the semiconductor thin film in a region in which the contact hole is to be formed, the gate electrode has a multiple-layer structure in which an undermost layer consists of the same metal as a metal composing the silicide layer, and an upper layer consists of the silicide layer extending towards at least one of the source region and the drain region with respect to the outermost edge of the undermost layer, the gate electrode serving as a mask, and the semiconductor thin film has an LDD structure in which impurity ions are distributed corresponding to a capability of shielding impurity ions retained by the gate electrode serving as a mask.

According to a 39th aspect of the invention, in the transistor of the 38th aspect, the silicide in each of the gate electrode, the source electrode, and the drain electrode may be a silicide of one of titanium, nickel, platinum, and cobalt.

According to a 40th aspect of the invention, in the transistor of the 39th aspect, the semiconductor thin film may have a thickness of 650 Å or less, and each of the source electrode and the drain electrode may have a diameter of 4 μm or smaller in a portion being in contact with the silicide layer.

In the above 35th to 40th aspects of the invention, the same effects as those of the 23rd to 28th aspects are achieved.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

Now, with reference to the figures, the preferred embodiments of the present invention are described below.

EXAMPLE 1

This example is among the examples in accordance with the first group of the present invention.

Figure 1:
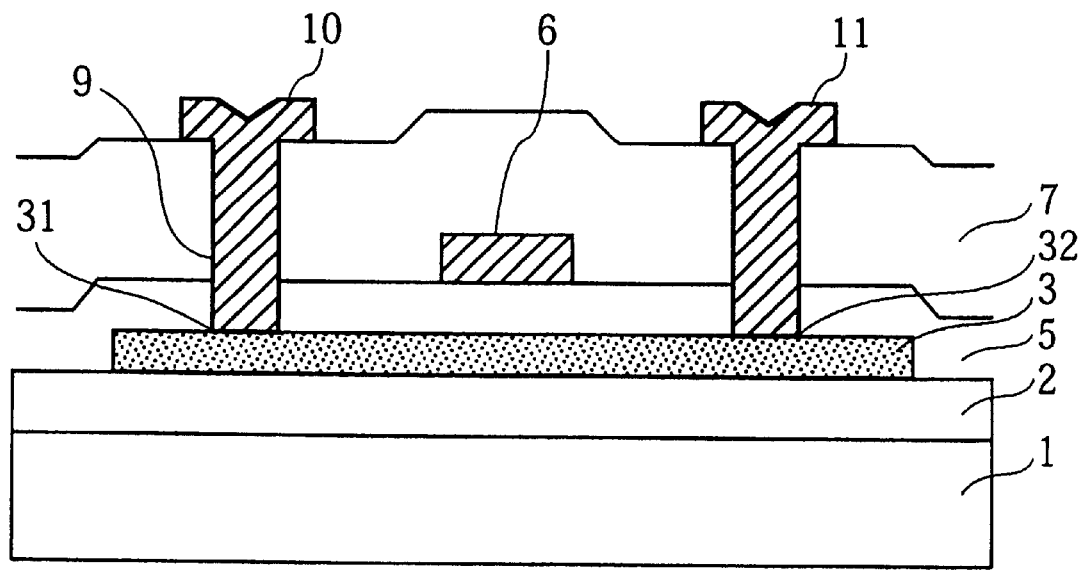
FIG. 1 is a cross-sectional view showing a construction of a conventional TFT.
Figure 2:
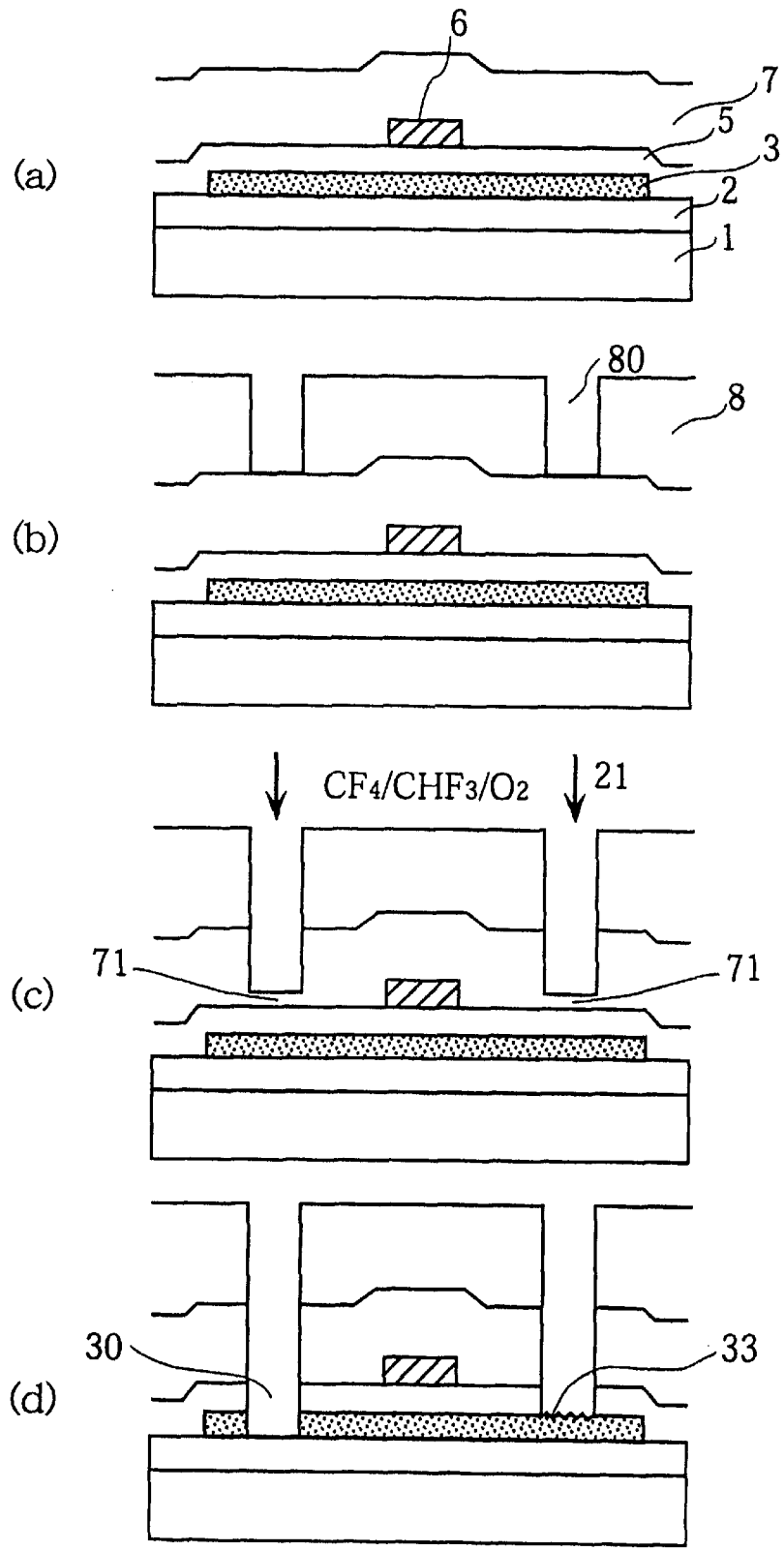
FIG. 2 is a diagram showing producing steps of a transistor in accordance with a conventional method of producing a thin film transistor.
Figure 3:
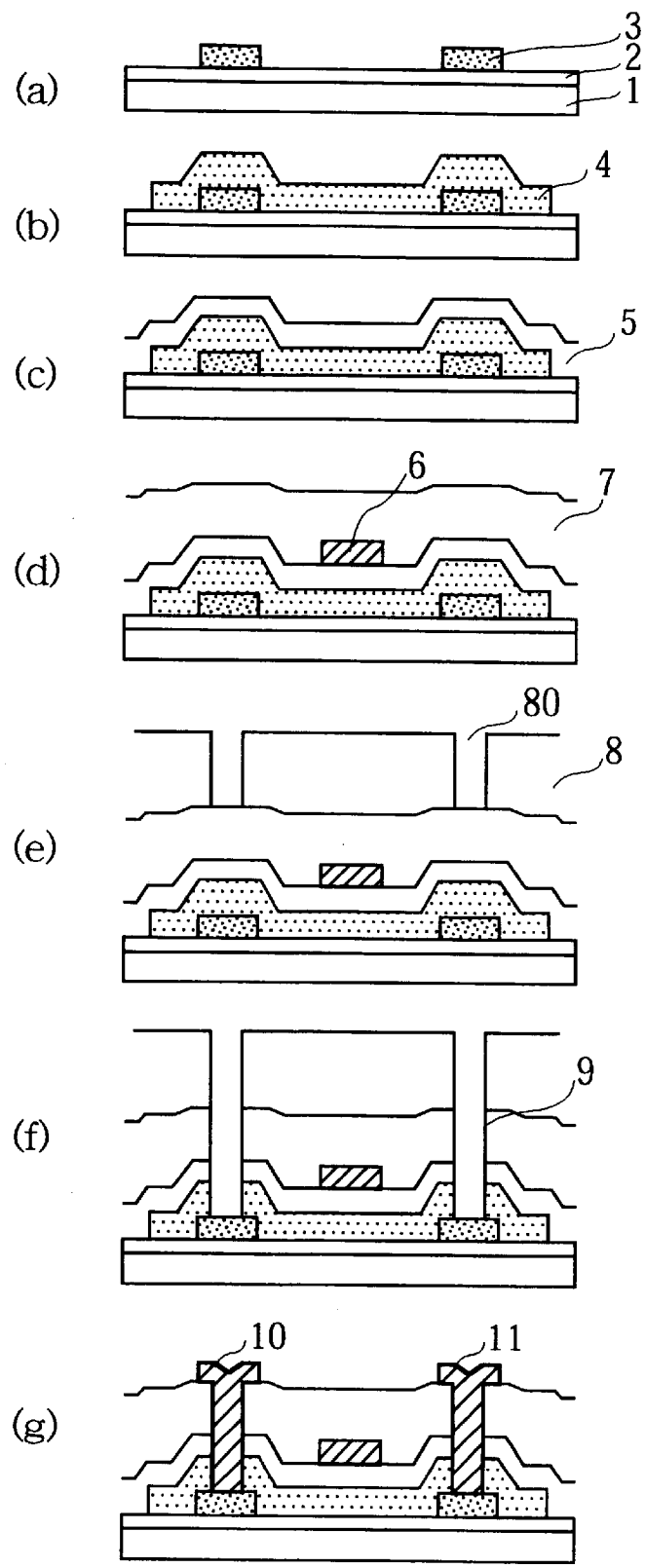
FIG. 3 is a diagram showing producing steps of a transistor in accordance with Example 1 of the present invention.

FIG. 3 schematically shows a producing method of a thin film transistor in accordance with the present invention. More specifically, the figure illustrates a process of producing the thin film transistor according to each step. Now referring to FIG. 3, the process is detailed below.

(a) An $SiO_2$ layer 2, which serves as an undercoat, is formed on an entire area of a glass substrate 1. Following this, a silicon film 3 is formed only on the positions in the $SiO_2$ layer 2 where a source electrode and a drain electrode are to be formed, so as to have a thickness of approximately several hundred angstroms. It is noted here that a position of the $SiO_2$ layer 3 to be formed and a position of the TFT to be formed are determined by a configuration of pixels and drivers of the required liquid crystal display panel and the like. For a method to form a silicon film only in a specific region, various methods are known, such as a method by at first forming a silicon film on an entire area of a substrate and thereafter removing an unnecessary portion of the silicon film. However, since such methods are publicly known, the detailed description thereof is omitted herein unless they immediately relate to the present invention. Such omission of the description of conventional methods applies to films of other materials herein.

(b) A silicon film 4 is formed on only a region where the TFT is to be formed, so as to have a thickness of several hundred angstroms. Thus, a two-layer structure by the silicon films 3 and 4 is formed in a region of the silicon film 4 where a contact is subsequently formed, and thereby the region of the silicon film 4 where a contact is subsequently formed is made to be thicker than the channel region.

It is noted that in this example the silicon films 3 and 4 are formed by means of a CVD method, and are poly-crystalized by excimer laser annealing and the like method.

(c) A gate insulating film 5 is formed on an entire area of the substrate. It is noted that a CVD method is preferable to form the gate insulating film 5, and that the thickness of the gate insulating film 5 is approximately several hundred angstroms.

(d) A gate electrode 6 made of a metal film is formed in a predetermined region determined by a configuration and shape of the desired TFT. In this example, an aluminum alloy film is employed for the gate electrode 6 since it is a low resistance material. Thereafter, an interlayer dielectric layer 7 is formed in the entire area of the substrate to have a thickness of 5000 Å. The interlayer dielectric layer 7 is composed of an $SiO_2$ film and formed by a CVD method. It is noted that the thickness of the interlayer dielectric layer 7 is preferred to be several thousand angstroms.

(e) A pre-treatment for forming a contact hole is carried out. More specifically, in order to provide a contact hole in each of the positions corresponding to a source electrode and a drain electrode, a resist 8 is applied on the interlayer dielectric layer 7, and a resist pattern is thus formed. In FIG. 3(e), it is shown that the resist 8 is not formed in each of the positions of the interlayer dielectric layer 7 where contact holes are to be formed, and instead a hole 80 is provided.

(f) The interlayer dielectric layer 7 and the gate insulating film 5 are processed by dry etching to form a contact hole 9 at each position corresponding to the source electrode and the drain electrode. Reactive ion etching (RIE) is employed for this process with the use of a mixed gas of $CF_4$ and $CHF_3$ and $O_2$ as an etching gas.

In this step, since a region of the silicon films 3 and 4 under the contact hole and the vicinity thereof is made to be a two-layer structure, and therefore, even if a slight overetching is performed to completely remove the interlayer dielectric layer 7 and the gate insulating film 5 in the contact hole 9, such trouble that the silicon films are etched away does not occur.

As a consequence, a good contact hole is achieved since $SiO_2$ as the interlayer dielectric layer does not remain in the bottom portion of the contact hole, while a semiconductor layer is sufficiently present. Furthermore, since the silicon film under the contact hole has a sufficient thickness, it is made possible to ensure a sufficient contact area of the silicon thin film and the source electrode or the drain electrode. It is noted that the same advantage is also attained in the other examples to be described hereinbelow.

(g) The resist pattern is removed, and a film for forming the source and drain electrodes is formed in the entire area of the substrate. Then, the film is etched away except the positions where the source electrode and the drain electrode are desired. In this way, a source electrode 10 and a drain electrode 11 are formed to have a good contact with the semiconductor layer via the contact holes 9.

It is to be noted that other steps may be performed depending on the requirement for the desired product, for example, such a step that impurity ions such as P ions and B ions are implanted in the regions of the source electrode, the drain electrode, and the gate electrode. However, since such steps are well known, the description of such a step is omitted here. The description of such steps is also omitted in the other examples to be described hereinbelow.

As has been described, according to this example, the semiconductor layer provided under the insulating film is made to be thick, and thereby, in a step of forming a contact hole, an overetching can be performed with a sufficient margin. Hence, forming a good contact hole is made possible throughout an entire area of a substrate.

In addition to the advantageous effect that a good contact of each electrode and each contact hole is provided, the following advantage is also achieved. Because of the restriction in forming the thick film portion (it is very difficult to make a region of the thick film to have exactly the same diameter as the contact hole), the silicon film is remained to be a cylinder-like shape in an outer peripheral area adjacent to the bottom of the formed contact hole. This also results in an increase of the contact area of the silicon film with the source electrode or the drain electrode formed in the contact hole, thereby reducing the contact resistance.

Moreover, the channel region, which largely relates to basic characteristics of a transistor, is left to be thin throughout the process, and is composed of large-sized crystal grains of silicon. Therefore, neither adverse effects are caused in laser annealing for the fusion and recrystallization of the silicon, nor degradation is induced to the basic characteristics of a transistor. It is to be noted that these advantageous effects are also obtained in the other examples to be described hereinbelow.

Further, since there is a sufficient margin for overetching in forming contact holes, a mental burden to workers engaged in the manufacturing can be alleviated, leading to an improvement of productivity.

In addition, by producing a thin film transistor according to the above-described method, it is made possible to reliably form a contact hole by dry etching throughout the entire area of a large-sized panel substrate. In other words, stable characteristics and a good contact resistance are obtained in each of the transistors formed thereby. It is noted that the same advantageous effects are obtained in the other examples to be described hereinbelow.

EXAMPLE 2

Figure 4:
FIG. 4 is a diagram showing producing steps of a transistor in accordance with Example 2 of the present invention.
Figure 4:
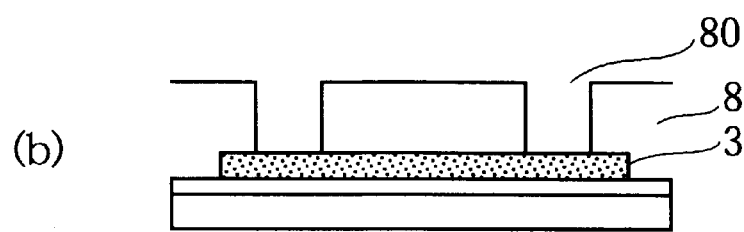
Figure 4:
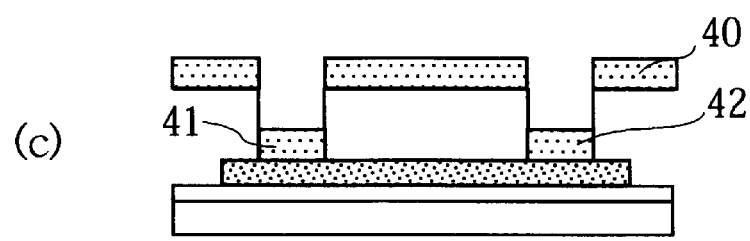
Figure 4:
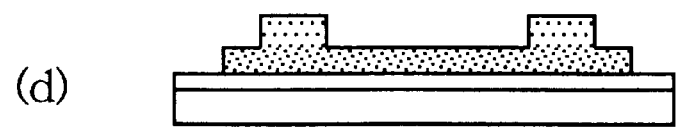
Figure 4:
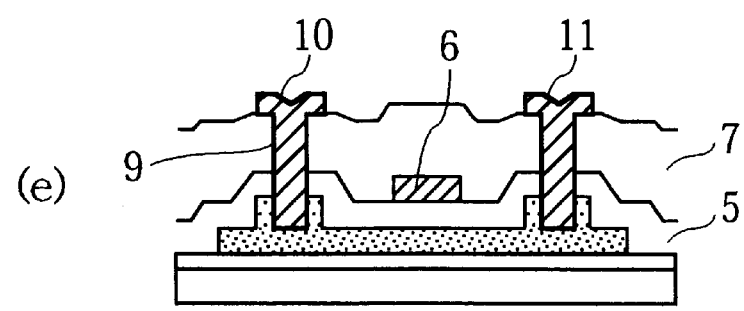

FIG. 4 illustrates a producing method a thin film transistor in accordance with Example 2 of the present invention. Referring now to FIG. 4, a process flow of the producing method is detailed below.

(a) An $SiO_2$ film 2, serving as an undercoat, is formed on an entire area of a substrate (glass substrate) 1. Subsequently, a first silicon film 3 is formed on only the position in the $SiO_2$ layer 2 where the TFT is desired, so as to have a thickness of approximately several hundred angstroms.

(b) A silicon film is selectively formed on only the positions in the $SiO_2$ film 2 where a source electrode and a drain electrode of the TFT are to be formed. More specifically, in this example, a lift-off method is employed for this step. Accordingly, in order to form a silicon film on a position corresponding to a source electrode or a drain electrode, a resist is applied on a region except each of the positions corresponding to the source electrode and the drain electrode, to form a resist pattern 8. An aperture 80 is thereby formed in each of the corresponding positions in the resist layer.

(c) Then, the silicon film is formed on the entire area of the substrate so as to have a thickness of approximately several hundred angstroms. Thereby, on the first silicon film 3, second silicon films 41 and 42 are formed in only each of the positions where the source electrode and the drain electrode are to be formed and in the vicinity thereof. The second silicon films 41 and 42 are not formed on the other regions in the first silicon film 3, since the resist layer serves as a mask.

(d) The resist pattern 8, on which the second silicon film is formed except on the aperture 80, is removed together with the silicon film 40 formed thereon. Consequently, the second silicon films 41 and 42 are selectively left in the positions where the source electrode and the drain electrode are to be formed and in the vicinity thereof. Thus, each of the regions with which the source electrode and the drain electrode are to be connected (to make contact) is made to have a two-layer structure, and therefore to have a larger thickness than that of the channel region.

(e) The silicon films 3, 41, and 42 are simultaneously poly-crystallized by means of excimer layer annealing and the like method, to form a poly-silicon film. Thereafter, a gate insulating film 5, a gate electrode 6, an interlayer dielectric layer 7, contact holes 9, a source electrode 10 and a drain electrode 11 are formed in a similar manner in the above Example 1, to produce a TFT.

As apparent from the above description, according to this example, as well as in the previous example, a semiconductor layer in each region corresponding to a source electrode and a drain electrode is made to be thick, and thereby, an overetching can be performed with a sufficient margin when forming a contact hole. As a result, it is made possible to completely remove the insulating layers, while a sufficient semiconductor layer is left unetched. Hence, the formation of a good contact hole can be achieved for each of the transistors provided throughout an entire area of a substrate.

EXAMPLE 3

Figure 5:
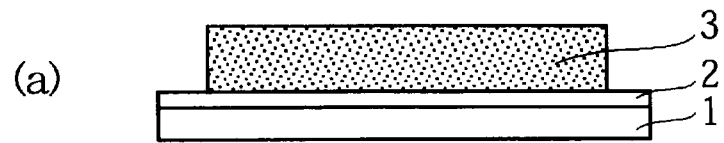
FIG. 5 is a diagram showing producing steps of a transistor in accordance with Example 3 of the present invention.
Figure 5:
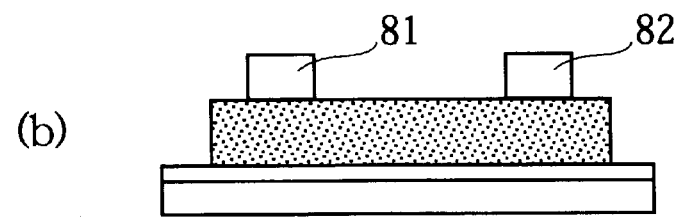
Figure 5:
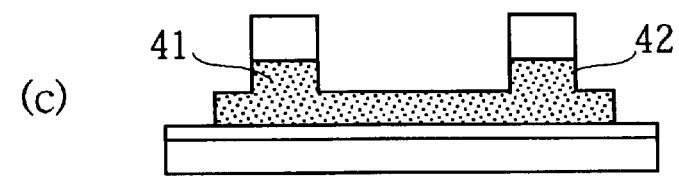
Figure 5:
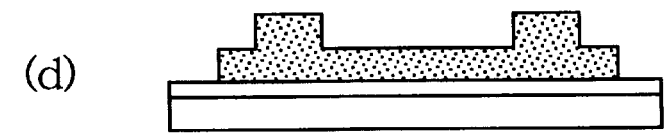
Figure 5:
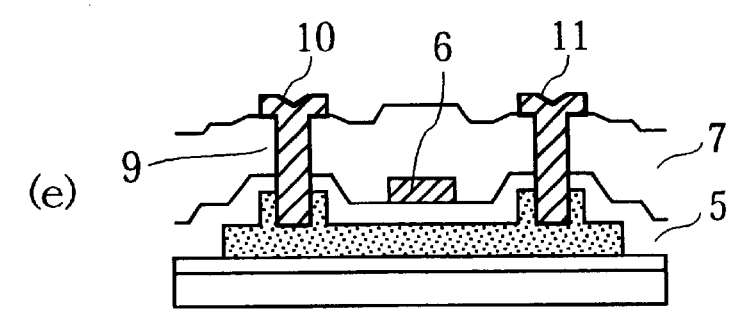

FIG. 5 illustrates a producing method of a thin film transistor in accordance with Example 3 of the present invention. Referring now to FIG. 5, the producing method is detailed below.

(a) An $SiO_2$ film 2, serving as an undercoat, is formed on an entire area of a substrate (glass substrate) 1. Subsequently, a silicon film 3 is formed on only the position in the $SiO_2$ layer 2 where a TFT is desired, so as to have a thickness larger than an essentially required thickness, more specifically, so as to have a thickness of from approximately several hundred angstroms to one thousand several hundred angstroms.

(b) The silicon film is then processed to be thick only in the positions where the source electrode and the drain electrode are to be formed. Specifically, this can be carried out by the following procedure. First, resists 81 and 82 are applied on only the positions corresponding to the source electrode and the drain electrode to form a resist pattern.

(c) Using the resist pattern as a mask, the silicon film 3 is etched to result in a thickness of several hundred angstroms, which is a thickness essentially required. Thus, portions 41 and 42 of the silicon film are left being thick.

(d) The resist pattern is removed so as to leave the silicon film to be thicker in only the positions where the source electrode and the drain electrode are to be formed and in the vicinity of the positions. Thereafter, the silicon film is poly-crysized by exciner laser annealing and the like means to form a poly-silicon film. It is to be noted here that the silicon film formed through two steps is annealed by one step of laser annealing, and this is in order to reduce the number of times of the laser annealing step and to crystallize the entire region of the silicon film with different thicknesses, as well as to improve the characteristics of the product.

(e) Subsequently, a gate insulating film 5, a gate electrode 6, an interlayer dielectric layer 7, contact holes 9, a source electrode 10 and a drain electrode 11 are formed in the same manner as in the above Example 1, to produce a TFT.

As apparent from the above description, according to this example as well as in the previous examples, a semiconductor layer in a region corresponding to the source electrode or the drain electrode is formed to be thick, and thereby, an overetching can be performed with a sufficient margin when forming the contact hole. As a result, it is made possible to completely remove the insulating layers, while a sufficient semiconductor layer is left unetched. Hence, the formation of a good contact hole can be achieved in each of the transistors provided on an entire area of a substrate.

EXAMPLE 4

Figure 6:
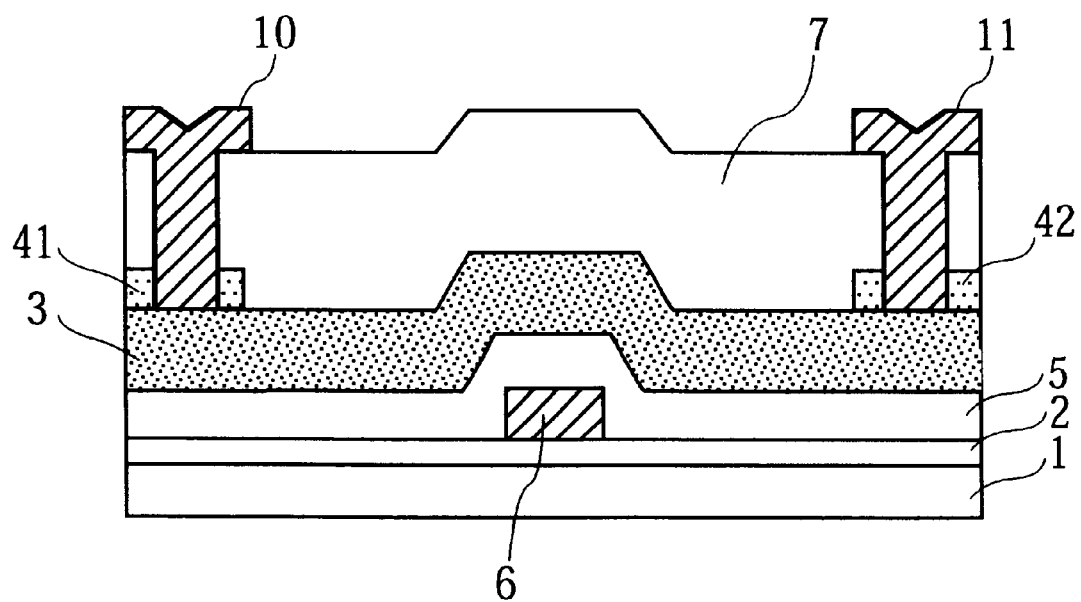
FIG. 6 is a cross-sectional view showing a construction of a thin film transistor (bottom-gated type) in accordance with Example 4 of the present invention.

This example relates to a bottom gated type transistor. FIG. 6 illustrates a cross-sectional view of a construction of a transistor in accordance with Example 4 of the present invention.

In the figure, there is shown a glass substrate 1, an $SiO_2$ film 2 serving as an undercoat, a poly-silicon film 3, a gate insulating film 5, a gate electrode 6 formed on the substrate, an interlayer dielectric layer 7, a source electrode 10, and a drain electrode 11.

As shown in FIG. 4, regions 41 and 42 of the poly-silicon film 3, corresponding to the positions where the source electrode and the drain electrode are to be formed and in the vicinity thereof, are made to be thicker than the rest of the regions in the poly-silicon film 3. Therefore, in this example as well as in the previous examples, there is no risk that the poly-silicon film is removed in forming a contact hole in the interlayer dielectric layer. Moreover, a sufficient contact area of the poly-silicon film with the source and the drain electrode is obtained, and there is no risk that the characteristics of the poly-silicon in the channel region are degraded.

It is noted that the description regarding a producing method of the TFT in accordance with this example is omitted since the same technique as in the previous examples is employed therefor.

EXAMPLE 5

This example and Examples 6 and 7 to be described below pertains to the second group of the present invention.

Figure 7:
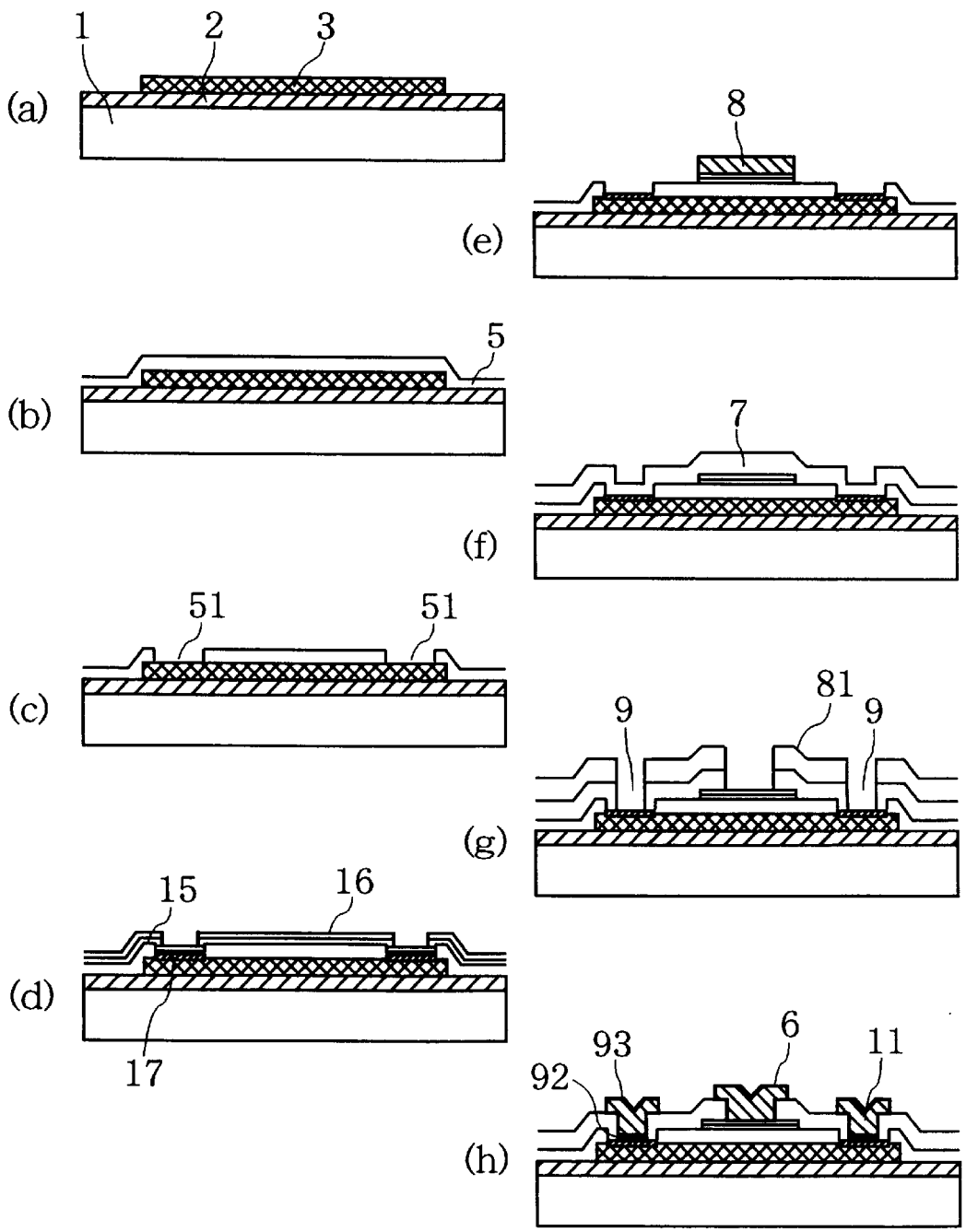
FIG. 7 is a diagram showing producing steps of a transistor in accordance with Example 5 of the present invention.

With reference to FIG. 7, a producing method of a thin film transistor in accordance with Example 5 of the present invention is described below.

(a) An $SiO_2$ film 2 serving as an undercoat is formed on an entire area of a glass substrate 1. Then, a poly-silicon film 3 is selectively formed on only the position where the thin film transistor is desired.

(b) A gate insulating film 5 is formed over the entire area of the substrate with a CVD method, so as to have a thickness of several hundred angstroms.

(c) A portion of the gate insulating film 5 in each region 51, where a source electrode and a drain electrode are subsequently formed, are removed. When removing the portion of the gate insulating film 5, it is desired that wet etching be employed to selectively remove only the gate insulating film 5 therein and to minimize a possible damage to the poly-silicon film 3. A diluted hydrofluoric acid or a mixed solution of hydrofluoric acid and ammonium fluoride is employed as an etchant therefor.

(d) A titanium film 15 and then an aluminum alloy film 16, which has a low electrical resistance, are formed in the entire area of the substrate each to have a thickness of several thousand angstroms.

Thereafter, a heat treatment is performed at approximately 300–400° C., a temperature sufficiently lower than the heat resistance limit of the glass substrate. In the heat treatment, in the positions where the source electrode and the drain electrode are to be formed, the gate insulating film is removed and the poly-silicon film is in direct contact with the titanium film. As a result, in these positions, silicon diffuses into the titanium film, and thereby a titanium silicide layer 17 is formed. The titanium silicide layer 17 has a thickness sufficient for ensuring a good electrical contact and for serving as a stopper in dry etching.

It is noted that, by employing a sputtering method in forming the titanium film, the formation of the titanium silicide layer at the interface is possible without using the heat treatment. In addition, the metal used for forming the silicide layer is not limited to titanium, but may be other metals capable of forming a silicide layer with silicon at a temperature of approximately 200–450° C., such metals as nickel, platinum, cobalt, and the like.

(e) To form a gate electrode, a resist pattern 8 corresponding to the gate electrode is formed, and subsequently the aluminum alloy film 16 and the titanium film 15 are etched away. In this etching, the aluminum alloy film 16 may be etched by either dry etching or wet etching, but the titanium film 15 should be etched by wet etching, in order to prevent a possible damage to the poly-silicon film 3 and the titanium silicide layer 17. In this etching, the portion of the titanium film 15 not reacted with silicon is removed in the regions corresponding to the source electrode and the drain electrode. Thus, a surface of the poly-silicon film 3 turns to be a silicide only in the positions where source electrode and the drain electrode are to be formed.

(f) Thereafter, the resist pattern 8 is removed, and an interlayer dielectric layer 7 is formed on the entire area of the substrate. Specifically, an $SiO_2$ film is formed to have a thickness of 5000 Å by means of a CVD method. It is preferable that the thickness of the film be several thousand angstroms.

(g) A contact hole 9 is formed in each of the positions corresponding to the gate electrode, the source electrode, and the drain electrode. More specifically, a resist layer, i.e., a resist pattern 81 is formed except each of the positions corresponding to the electrodes, to form the contact hole 9 at each position corresponding to the electrodes. Thereafter, by dry etching, a contact hole 9 is formed at each of the corresponding positions to the electrodes.

For this etching, reactive ion etching (RIE) is performed with the use of a mixed gas of $CF_4/CHF_3/O_2$. This dry etching gas does not etch away the silicide layer 17 formed in each of the positions corresponding to the source electrode and the drain electrode. As a result, a selective etching ratio of the silicide layer 17 and the interlayer dielectric layer 7 can be rendered high, and therefore the poly-silicon film 3 is not damaged even when an overetching is performed. Thus, forming a good contact hole can be achieved without such undesirable effects that $SiO_2$ of the interlayer dielectric layer 7 remains unetched in the bottom portion of the contact hole and that an etching defect is caused by an etching rate variation within a substrate.

(h) After removing the resist pattern 81, a titanium film 92 is formed thin on the entire area of the substrate, and subsequently an aluminum alloy film 93 is formed thereover. The titanium film 92 is composed of the same metal as the metal composing the silicide layer, and therefore exhibits a good contact with the silicide layer. The aluminum alloy film 93 shows a good contact with the titanium film 92 since both films are composed of metal. The aluminum alloy film 93 has a low electrical resistance, and is left unetched by etching gas for the interlayer dielectric layer.

Subsequently, the titanium film 92 and the aluminum alloy film 93 are removed by etching so that the both films 92 and 93 are left unetched in only the positions corresponding to the gate electrode, the source electrode, and the drain electrode. Thus, a gate electrode 6, a source electrode 10, and a drain electrode 11 are formed.

As has been described, according to this example, the reduction of a contact resistance between a semiconductor film and a source and a drain electrode is achieved, since a silicide layer so formed to have a secure contact with the semiconductor film and the source and the drain electrode is provided therebetween. Moreover, a high selectivity can be attained in dry etching of an interlayer dielectric layer and the like, and as a result, a damage to the semiconductor film caused by overetching is reduced.

Additionally, the experiments by the present inventors have found that the effect of reducing electrical resistance is particularly noticeable when a diameter of the contact hole is 5 μm or smaller, more preferably 4 μm or smaller. The effect of reducing electrical resistance is also particularly noticeable when a thickness of the semiconductor film is 650 Å or less.

These advantages described above are also attained in Examples 6 and 7 to be described below. In addition, it is noted that the same advantageous effects as attained in the previous Examples 1 to 4 are also attained in this example, as well as Examples 6 and 7 below.

EXAMPLE 6

Figure 8:
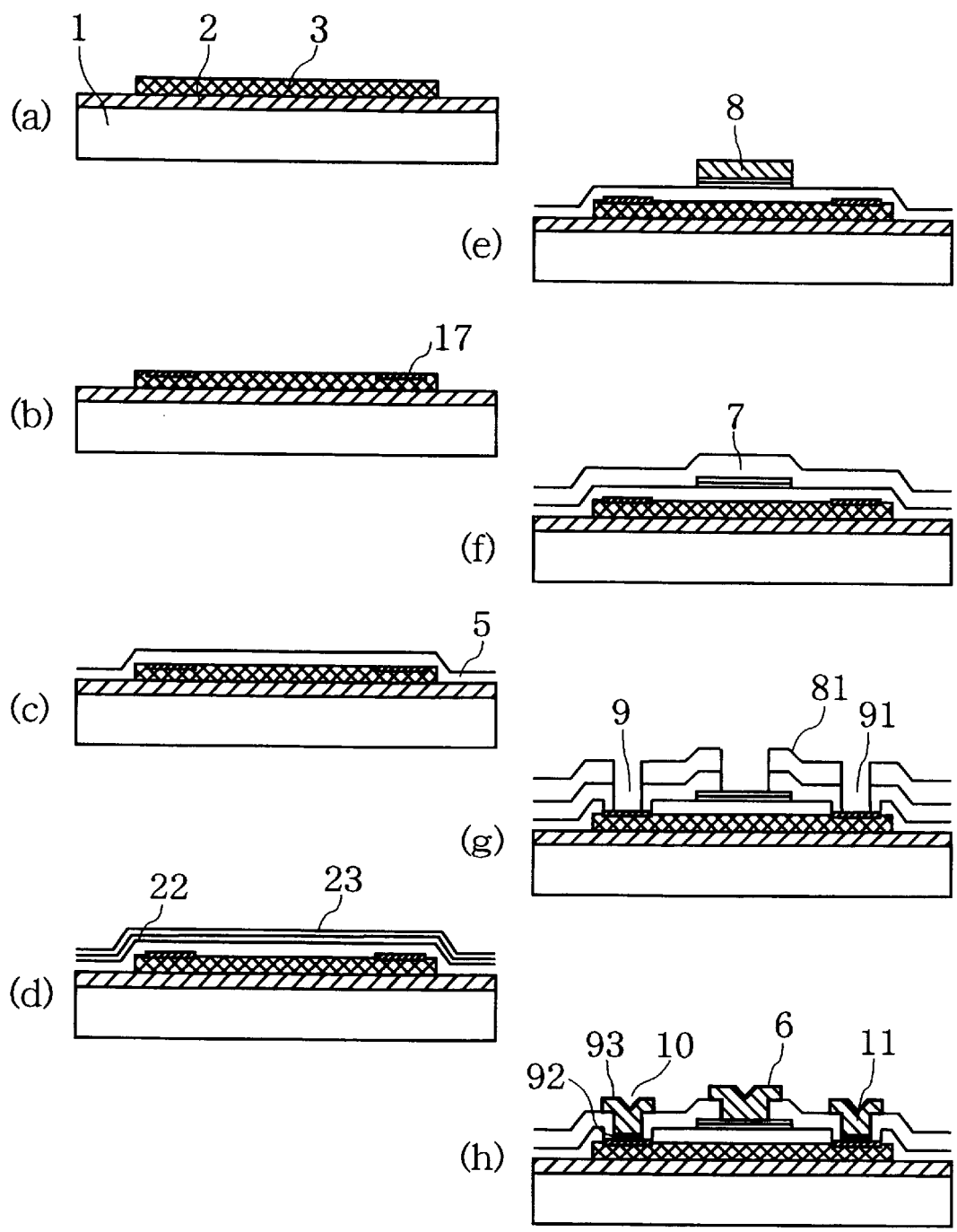
FIG. 8 is a diagram showing producing steps of a transistor in accordance with Example 6 of the present invention.

Now referring to FIG. 8, there is detailed a producing method of a thin film transistor in accordance with another example of the present invention.

(a) An $SiO_2$ film 2 serving as an undercoat is formed on an entire area of a glass substrate 1. Then, a poly-silicon film 3 is selectively formed on only the region where a thin film transistor is desired.

(b) A titanium silicide layer 17 is formed on only positions corresponding to a source electrode and a drain electrode to be subsequently formed. As a method for selectively forming the titanium silicide layer on only a required position, two types of methods described below may be employed.

1) According to a first method, at first, a resist pattern is so formed to have an aperture in only a position where a titanium silicide layer is desired. Then, a titanium film is formed on an entire area of the substrate, and subsequently the resist pattern is removed by a lift-off method to leave the titanium film selectively in only a required region. Thereafter, a heat treatment is performed at approximately 300–450° C. for approximately one hour, to cause a reaction of the titanium film and the poly-silicon film and thereby to form a titanium silicide layer 17 at the interface of the titanium film and the poly-silicon film 3. Finally, unreacted portion of the titanium film is etched away with the use of an acid type etchant. It is noted here that when a sputtering method is employed in forming the titanium film, it is possible to omit the heat treatment, or to reduce the treatment time.

2) According to a second method, after forming the poly-silicon film 3, a titanium film is formed on an entire area of the substrate, and then a resist pattern is formed on only the regions corresponding to the source electrode and the drain electrode. Thereafter, excessive portion of the titanium film is removed with the use of an acid type etchant and thereby the titanium film is left unetched on only the regions corresponding to the source electrode and the drain electrode. Note that in this case, the titanium film should be formed by either resistive heating or EB deposition. Thereafter, a heat treatment as described in the above first method is performed to form a titanium silicide layer 17 at the interface of the titanium film and the poly-silicon film. Finally, unreacted portion of the titanium film is etched away with the use of an acid type etchant.

(c) A gate insulating film 5 with a thickness of approximately several hundred angstroms is formed on the entire area of the substrate by a CVD method.

(d) A titanium film 22 is stacked over the entire area of the substrate, and thereafter an aluminum alloy film 23 is stacked thereover. Each of the films is made to have a thickness of several thousand angstroms.

(e) To form a gate electrode, a resist pattern 8 corresponding to the gate electrode, and subsequently the aluminum alloy film 23 and the titanium film 22 are etched away. In this etching, the aluminum alloy film 16 may be etched by either dry etching or wet etching.

(f) Thereafter, the resist pattern 8 is removed, and an interlayer dielectric layer 7 is formed on the entire area of the substrate. Specifically, an $SiO_2$ film is formed to have a thickness of 5000 Å with the use of a CVD method. It is preferable that the thickness of the film be several thousand angstroms.

(g) A contact hole is formed. Specifically, in order to form a contact hole 9 in each of the positions corresponding to the gate electrode, the source electrode, and the drain electrode, a resist pattern, i.e., a resist pattern 81 is formed except on each position corresponding to the electrodes. Thereafter, the contact hole 9 is formed by dry etching at each of the positions where the gate electrode, the source electrode, and the drain electrode are to be formed.

For this etching, reactive ion etching (RIE) is performed with the use of a mixed gas of $CF_4/CHF_3/O_2$. This dry etching gas does not etch away the silicide layer 17 formed in each of the positions corresponding to the source electrode and the drain electrode. As a result, a selective etching ratio of the silicide layer 17 and the interlayer dielectric layer 7 can be rendered high, and therefore the poly-silicon film 3 is not damaged even when an overetching is performed. Thus, forming a good contact hole can be achieved without such undesirable effects that $SiO_2$ of the interlayer dielectric layer 7 remains unetched in the bottom portion of the contact hole and that an etching defect is caused by an etching rate variation within a substrate.

(h) After removing the resist pattern 81, a titanium film 92, which exhibits a good contact with the titanium silicide layer 17, is formed thin in the entire area of the substrate, and subsequently an aluminum alloy film 93, which has a larger thickness than the titanium film 92 and exhibits a low electrical resistance, is formed thereover so as to have a thickness larger than a depth of the contact hole 9. The aluminum alloy film 93 shows a good contact with the titanium film 92 since they are both composed of metal.

Thereafter, the titanium film 92 and the aluminum alloy film 93 are removed by etching so that both films 92 and 93 in only the positions corresponding to the gate electrode, the source electrode, and the drain electrode are left unetched. Thus, a gate electrode 6, a source electrode 10, and a drain electrode 11 are formed.

According to this example, as well as the above Example 5, the reduction of a contact resistance between a semiconductor film and a source and a drain electrode is achieved, since a silicide layer so formed to have a secure contact with the semiconductor film and the source and the drain electrode is provided therebetween. Moreover, a high selectivity can be attained in dry etching of an interlayer dielectric layer and the like, and as a result, a damage to the semiconductor film caused by overetching is reduced.

EXAMPLE 7

Figure 9:
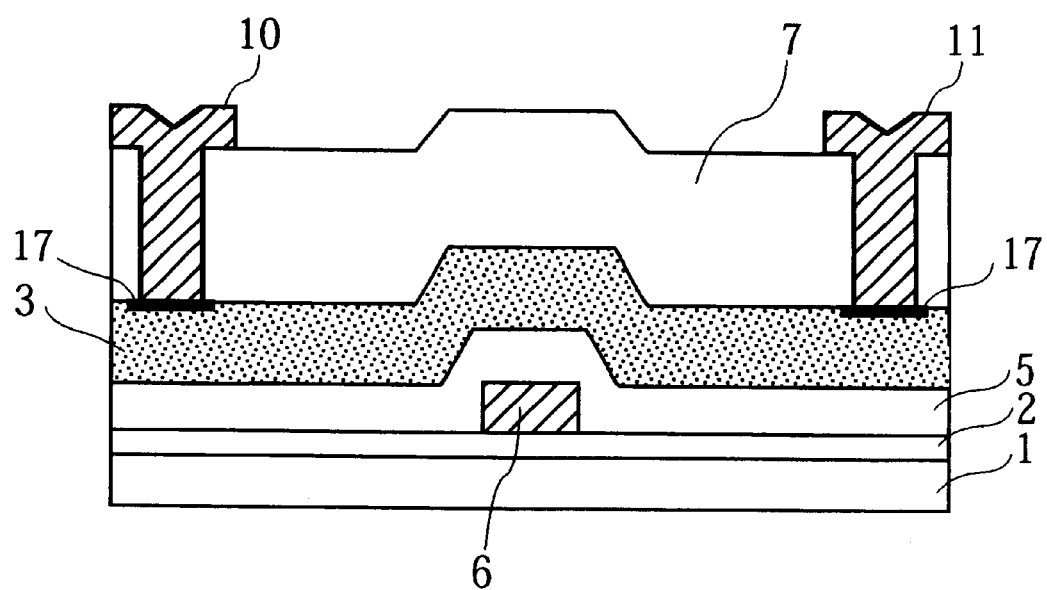
FIG. 9 is a cross-sectional view showing a construction of a thin film transistor (bottom-gated type) in accordance with Example 7 of the present invention.

This example relates to a bottom gated type transistor. FIG. 9 illustrates a cross-sectional view of a construction of a transistor in accordance with Example 7 of the present invention.

In the figure, there is shown a glass substrate 1, an $SiO_2$ film 2 serving as an undercoat, a poly-silicon film 3, a gate insulating film 5, a gate electrode 6 formed on the substrate, an interlayer dielectric layer 7, a source electrode 10, and a drain electrode 11.

As shown in FIG. 9, a titanium silicide layer 17 is formed in each of the regions on the poly-silicon film 3, corresponding to the positions where the source electrode 10 and the drain electrode 11 are to be formed and in the vicinity thereof. Therefore, in this example as well as in the previous Examples 5 and 6, there is no risk that the poly-silicon film 3 is removed in forming a contact hole in the interlayer dielectric layer 7. Moreover, a sufficient contact area of the poly-silicon film 3 with the source electrode 10 or the drain electrode 11 is obtained, and there is no risk that the characteristics of the poly-silicon in the channel region are degraded.

It is noted that the description regarding a producing method of the TFT in accordance with this example is omitted here for the sake of brevity since the same technique as in the previous Examples 5 and 6 is employed therefor.

EXAMPLE 8

This example relates to a transistor having characteristics in accordance with both the first group and the second group of the invention.

Figure 10:
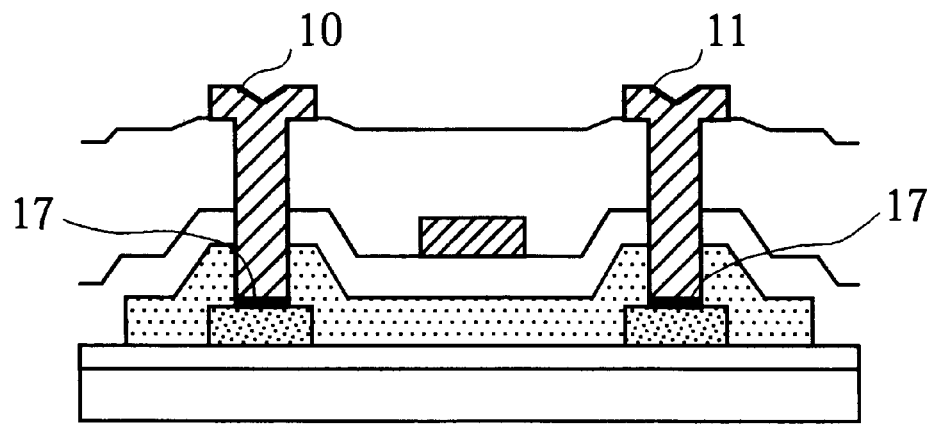
FIG. 10 is a cross-sectional view showing a construction of a thin film transistor in accordance with Example 8 of the present invention.
Figure 10:
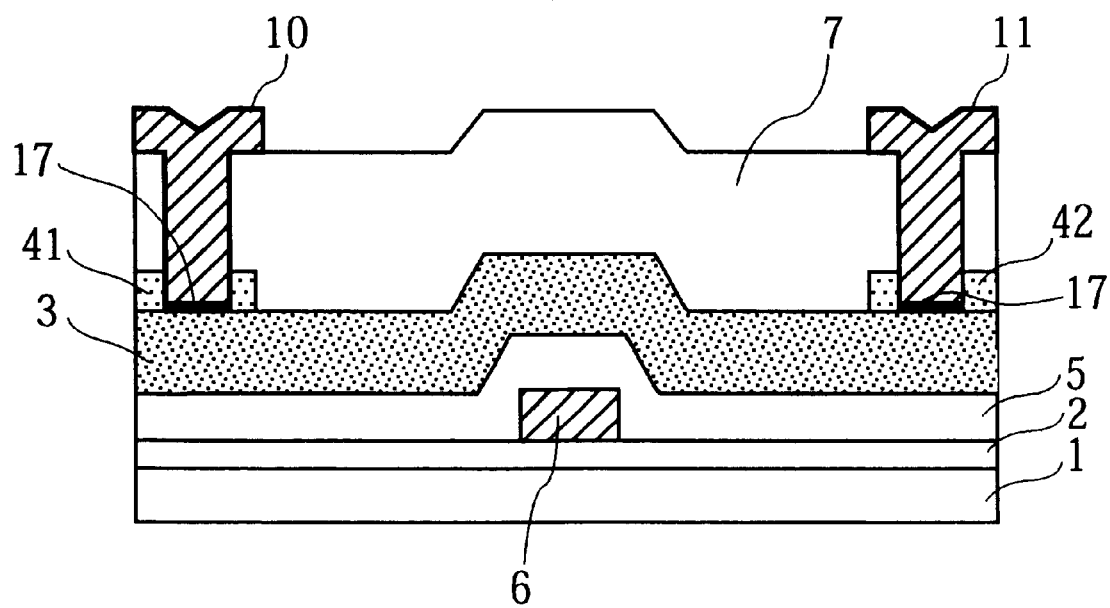

FIG. 10 shows a construction of the transistor. FIG. 10(a) shows an example of a transistor in which, in the transistor illustrated in FIG. 3(g), a silicide layer 17 is formed in a lower portion of each of the source electrode 10 and the drain electrode 11. FIG. 10(b) shows an example of a transistor in which, in the transistor illustrated in FIG. 6, a silicide layer 17 is formed in a lower portion of each of the source electrode 10 and the drain electrode 11.

The above transistors are produced in the same manner as in the previously described examples, and therefore the description thereof is omitted here.

According to these constructions, even when diameters of the drain electrode and the source electrode are small, a good electrical contact between the semiconductor layer and the electrodes is ensured.

EXAMPLE 9

This example is a variation of the above-described Example 5 described in FIG. 7.

Figure 11:
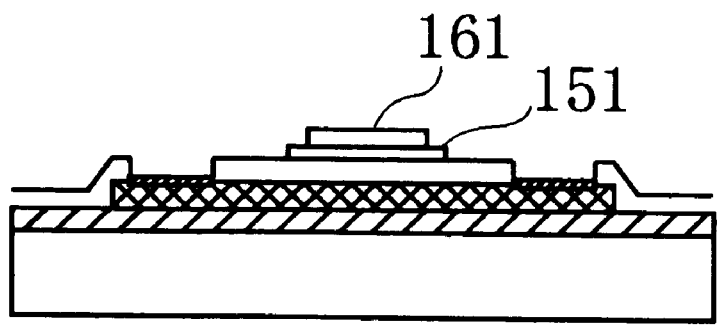
FIG. 11 is a diagram showing producing steps of a transistor in accordance with Example 9 of the present invention.
Figure 11:
Figure 11:
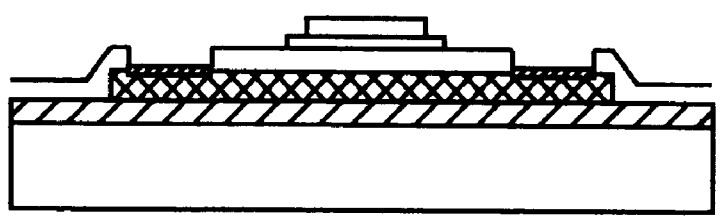
Figure 11:
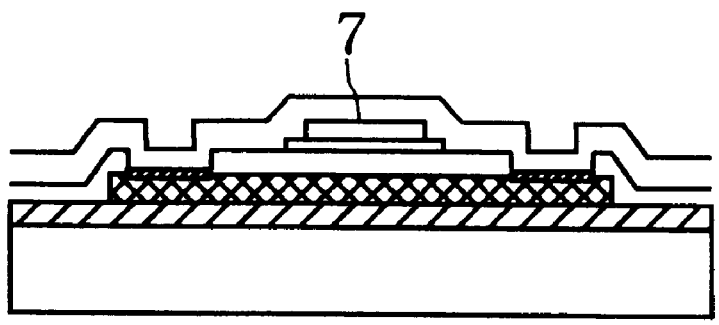

Now, Example 9 is detailed regarding only the differences from the above-described Example 5, with reference to FIG. 11, in which also only the differences from the above-described Example 5 are illustrated.

Up to the stage (d), the same steps as in Example 5 are performed.

(e-1) At the stage of (e) in FIG. 7, a titanium layer 151, which constitutes an undermost layer in a multi-layered gate electrode, is formed so as to extend 1–4 $\mu$m outwardly with respect to the most outer edge of an aluminum alloy layer 161 to be formed thereover.

(e-2) Thereafter, using the resulting gate electrode as a mask, impurity ions ('P' in the figure) are implanted.

In this step, the impurity ions are not doped in the channel region, on which the aluminum alloy layer 161 and the titanium layer 151 are stacked, because the mask has a sufficient thickness. In the region in which only the titanium layer 151 is present thereon, the impurity ions are doped to a certain degree because the mask is thinner than that of the channel region. In the other regions, the impurity ions are doped most since the mask is not provided thereon. Accordingly, a transistor having a lightly doped drain (LDD) structure is readily fabricated.

(f-1) An interlayer dielectric layer 7 is formed in the same manner as in the step of (f) in FIG. 7.

From this step onward, the same steps as in FIG. 7 are performed.

According to this example, high-energy hydrogen ions generated from a source gas of impurity or a dilution gas is prevented from entering the semiconductor layer, because titanium, which has a strong cohesive strength with hydrogen, is used for the mask for the channel region and the LDD regions. Consequently, the resulting transistor exhibits excellent characteristics.

EXAMPLE 10

This example is also another variation of the above-described Example 5 described in FIG. 7.

Figure 12:
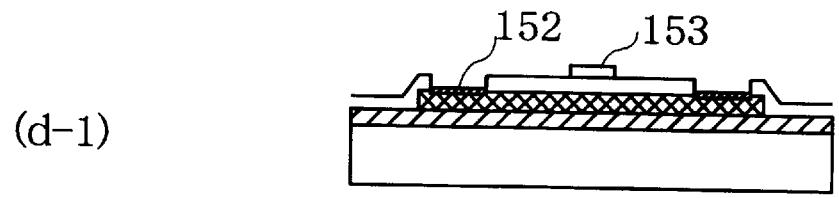
FIG. 12 is a diagram showing producing steps of a transistor in accordance with Example 10 of the present invention.
Figure 12:
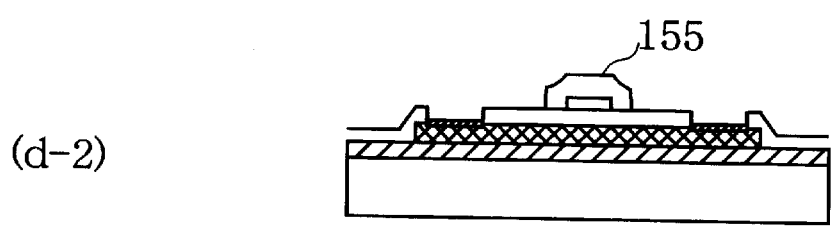
Figure 12:
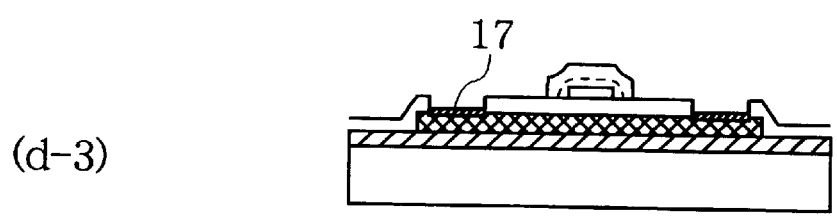
Figure 12:
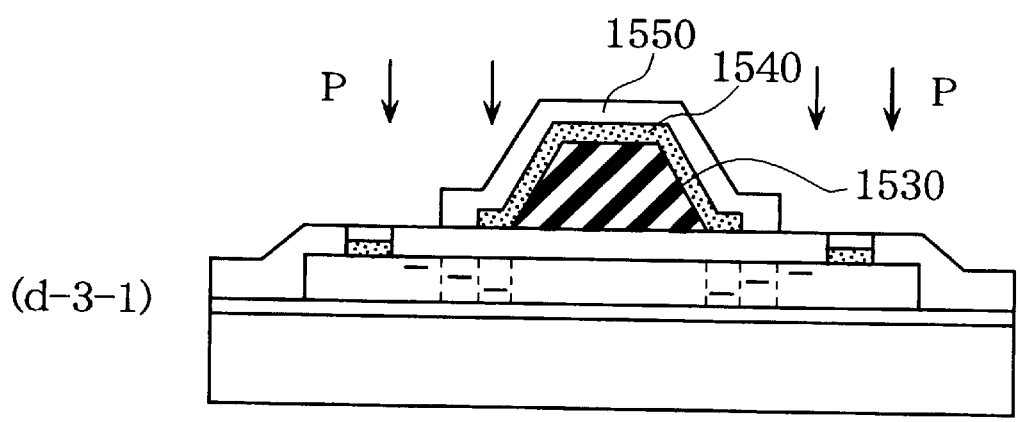
Figure 12:
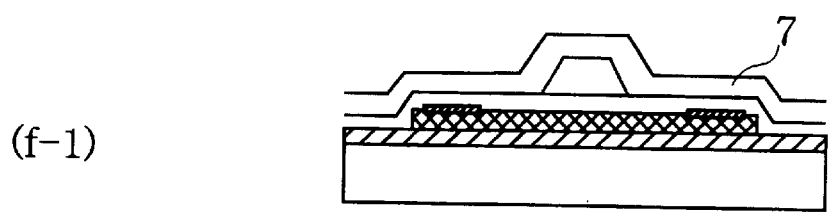

Now, Example 10 is detailed regarding only the differences from the above-described Example 5, with reference to FIG. 12, in which also only the differences from the above-described Example 5 are illustrated.

Up to the stage (c), the same steps as in Example 5 are performed.

(d-1) At the stage of (d) shown in FIG. 7, a titanium film 153 is formed in a position of the gate electrode, as well as a titanium film 152 in each of the positions of the source electrode and the drain electrode.

(d-2) A silicon film 155 is formed over the titanium film 153 so as to extend 1–4 µm outwardly with respect to the most outer edge of the titanium film 153.

(d-3) A heat treatment is performed to cause a reaction of the titanium film 153 and the silicon film 155, and thereby to form a silicide layer 1540 therebetween. By the heat treatment, a titanium film 1530 provided in the position of the gate electrode partially reacts with a silicon film 1550 thereover, thus forming a silicide layer 1540 therebetween.

(d-3-1) Subsequently, using the resulting gate electrode as a mask, impurity ions ('P' in the figure) are implanted.

The silicide has an approximately intermediate degree of shielding impurity ions between that of titanium (density: 4.5) and that of silicon (density: 2.3). Therefore, the gate electrode is made to have three stages of the degree of shielding. More specifically, the impurity ions are not doped in the channel region, on which the silicon film 1550 and silicide layer 1540 and titanium film 1530 are stacked, because the mask is sufficiently thick in the region. In the region on which the silicon film 1550 and silicide layer 1540 are present, the impurity ions are doped to a certain degree because the mask is thinner and smaller in density than that of the channel region. In the region on which only the silicon film 1550 is present, more impurity ions are doped than in the region on which the silicon film 1550 and the silicide layer 1540 are present. In the other regions, the impurity ions are doped most since the mask is not provided thereon. Accordingly, a transistor having a two-stage LDD structure is readily fabricated.

(f-1) An interlayer dielectric layer 7 is formed in the same manner as in the step of (f) in FIG. 7.

From this step onward, the same steps as in FIG. 7 are performed.

According to this example, high-energy hydrogen ions generated from a source gas of impurity or a dilution gas is prevented from entering the semiconductor layer, because titanium, which has a strong cohesive strength with hydrogen, is used for the mask for the channel region and the LDD regions. Moreover, a two-stage LDD structure is achieved. Therefore, the resulting transistor exhibits excellent characteristics.

Although the present invention has been detailed with reference to preferred embodiments thereof, those having ordinary skill in the art will readily realize that various modifications are possible without departing from the advantages therein.

In other words, one of the major features of the present invention is as follows; in view of the difficulty in forming a contact hole for a source and a drain electrode with an accurate depth in a microelectronic device utilizing a semiconductor thin film and a producing method thereof, which difficulty is due to the fact chemical characteristics of a material for the insulating film and a material for the semiconductor inevitably resemble each other, a portion of the semiconductor film where the contact hole is to be formed is made to have a sufficient thickness margin, while a channel region of the semiconductor film is kept in a state of a thin film.

In addition, another feature of the present invention is that silicide is utilized in order to provide a reliable electrical contact between a semiconductor film and a source and a drain electrode. Moreover, it is utilized that poly-silicon and amorphous silicon are capable of forming a silicide with such a metal as titanium and the like under a sufficiently low temperature.

Hence, unless departing from the spirit of the invention, all such modifications as are intended to be included within the scope of the present invention. For example, the following modifications may be performed.

1) The poly-crystallization step of the silicon film may be performed prior to the etching process.
2) The substrate may be made of quartz or the like.
3) Each of the thin films may be produced by other methods than the methods particularly described above.
4) The materials for the electrodes may be other metals and the like materials, such as copper, silver, and alloys thereof.
5) The semiconductor material may be other materials than silicon, for example, Si—Ge (the maximum content of Ge being 30%), Si—Ge—C (the maximum content of C being 5%), which have similar semiconductor characteristics and chemical properties to Si, or even other materials than silicon-based materials developed under future advancement of technology.
6) The margin of the film thickness in dry etching of the second silicon film and the like may be made smaller according to future advancement of technology.

In addition, in each of the positions where a source electrode and a drain electrode are to be formed, a diameter of a region where in which a thickness of the silicon film is increased may be made smaller than +1 µm or even +0 µm with respect to a diameter of the contact hole.

Further, the diameter of the silicide region may be made larger with respect to the diameter of the source and drain electrode, or even made smaller for some reason.

7) The size of the substrate is not restricted. In addition, the diameter of the silicide region may be 10 µm or larger, although the advantages of the present invention are remarkable when the diameter is 4 µm or smaller. Further, the thickness of the semiconductor layer may be 1000 Å or more, although the advantages of the present invention are remarkable when the thickness is 650 Å or less.
8) The shape of the contact hole may be other shapes than a cylindrical shape, such as a tapered cylindrical shape with the bottom diameter smaller than the top diameter, and the like.

Other similar modifications would also be apparent to those skilled in the art, and are intended to be encompassed within the appended claims.

What is claimed is:

1. A method of producing a thin film transistor comprising on a substrate, a gate electrode, a source electrode, a drain electrode, and a poly-crystallized semiconductor film comprised of one of silicon, silicon-germanium, and silicon-germanium-carbon wherein a channel region, a source region and a drain region are provided, said method comprising the steps of:

laser annealing a thin film comprised of one of amorphous silicon, amorphous silicon-germanium, and amorphous silicon germanium-carbon to polycrystallize the thin film; and forming a silicide layer on the poly-crystallized semiconductor thin film, wherein the silicide layer forms the lowermost layer of each of the source electrode and the drain electrode.

2. A method of producing a thin film transistor according to claim 1, wherein the silicide layer comprises a silicide of at least one metal selected from the group consisting of titanium, nickel, platinum, and cobalt.

3. A method of producing a thin film transistor according to claim 1, wherein:

each of the source electrode and the drain electrode comprises a plurality of metal layers;

a step of forming an undermost layer of the plurality of metal layers is performed prior to the step of forming a silicide layer, the undermost layer being formed at each of the positions on the poly-crystallized semiconductor thin film where the source electrode and the drain electrode are to be formed, and the undermost layer being a metal layer comprised of at least one metal selected from the group consisting of titanium, nickel, platinum, and cobalt; and the step of forming a silicide layer further comprises a step of reacting the metal in a lower portion of the undermost layer with silicon in an upper portion of the poly-crystallized semiconductor film to form the silicide layer.

4. A method of producing a thin film transistor comprising the steps of:

forming a silicon film in a predetermined region on a substrate, forming a gate insulating film on an entire area of the silicon film, forming a fist metal film by removing a portion of the gate insulating film located in each position where a source electrode and a drain electrode are to be formed and thereafter forming a first metal film on an entire area of the substrate, forming a silicide layer in a region where the first metal film is directly in contact with the silicon film, by reacting the first metal film with the silicon film with heat, forming an interlayer dielectric layer, by firstly removing the first metal film, thereafter forming, in a position on the silicon film where a gate electrode is to be formed, a second metal film composed of a metal resistant to an etching gas for etching the interlayer dielectric layer, and thereafter forming the interlayer dielectric layer on the entire area of the substrate, forming a contact hole by dry etching the interlayer dielectric layer utilizing the silicide layer and the second metal film as an etch stopper, so as to provide the contact hole in each of the positions corresponding to the gate electrode, the source electrode, and the gate electrode, and forming a third metal film on the entire area of the substrate and thereafter removing an excessive portion of the third metal film to form the gate electrode, the source electrode, and the drain electrode or an undermost layer thereof.

5. A method of producing a thin film transistor according to claim 4, wherein said silicon film is so formed as to have a thickness of 650 Å or less in the step of forming a silicon film, and the contact hole is so formed that a diameter of an undermost portion of the contact hole results in 4 $\mu$m or smaller in said step of forming a contact hole.

6. A method of producing a thin film transistor according to claim 5, wherein the same metal as a metal composing the first metal film is selected for a material for the third metal film prior to the step of forming a contact hole.

* * * * *